(12) United States Patent
Hori et al.

(10) Patent No.: US 11,791,795 B2
(45) Date of Patent: Oct. 17, 2023

(54) BONDED BODY OF PIEZOELECTRIC MATERIAL SUBSTRATE AND SUPPORTING SUBSTRATE

(71) Applicant: NGK INSULATORS, LTD., Nagoya (JP)

(72) Inventors: Yuji Hori, Owariasahi (JP); Takahiro Yamadera, Nagoya (JP)

(73) Assignee: NGK INSULATORS, LTD., Nagoya (JP)

(*) Notice: Subject to any disclaimer, the term of this patent is extended or adjusted under 35 U.S.C. 154(b) by 3 days.

(21) Appl. No.: 17/358,121

(22) Filed: Jun. 25, 2021

(65) Prior Publication Data

US 2021/0328569 A1 Oct. 21, 2021

Related U.S. Application Data

(63) Continuation of application No. PCT/JP2020/042099, filed on Nov. 11, 2020.

(30) Foreign Application Priority Data

Nov. 29, 2019 (JP) .................................. 2019-216520

(51) Int. Cl.
*H03H 9/02* (2006.01)
*H03H 3/08* (2006.01)
*H10N 30/072* (2023.01)

(52) U.S. Cl.
CPC .......... *H03H 9/02559* (2013.01); *H03H 3/08* (2013.01); *H03H 9/02834* (2013.01); *H10N 30/072* (2023.02)

(58) Field of Classification Search
CPC ....................... H03H 9/02559; H03H 9/02574
(Continued)

(56) References Cited

U.S. PATENT DOCUMENTS

2004/0159283 A1 8/2004 Harada et al.
2012/0194032 A1* 8/2012 Kadota .............. H03H 9/02559
310/313 A
(Continued)

FOREIGN PATENT DOCUMENTS

EP 3490144 A1 5/2019
EP 3490146 A1 5/2019
(Continued)

OTHER PUBLICATIONS

English Translation of the International Preliminary Report on Patentability, issued in corresponding International Application No. PCT/JP2020/042099, dated Jun. 9, 2022 (5 pages).
(Continued)

*Primary Examiner* — Derek J Rosenau
(74) *Attorney, Agent, or Firm* — FLYNN THIEL, P.C.

(57) ABSTRACT

A bonded body includes a supporting substrate; a piezoelectric material substrate composed of a material selected from the group consisting of lithium niobate, lithium tantalate and lithium niobate-lithium tantalate; and a bonding layer bonding the supporting substrate and the piezoelectric material substrate and contacting a main surface of the piezoelectric material substrate. It is provided that at least one of a bonding surface of the supporting substrate and a bonding surface of the piezoelectric material substrate is measured by X-ray reflectivity method and that 1 is assigned to a signal intensity in the case of total reflection. A relative intensity I of a reflected light from the bonding surface is approximated by the following formula (1) in a range of $1.0\times10^{-4}$ or larger and $1.0\times10^{-1}$ or smaller.

$$I = a(2\theta)^{-b} \quad (1)$$

($\theta$ represents an incident angle of an X-ray with respect to the bonding surface, a is $1.0\times10^{-5}$ or larger and $2.0\times10^{-3}$ or smaller, and b is 5.0 or larger and 9.0 or smaller.)

12 Claims, 8 Drawing Sheets

(58) Field of Classification Search
USPC ...... 310/313 R, 313 A, 313 B, 313 C, 313 D
See application file for complete search history.

(56) References Cited

U.S. PATENT DOCUMENTS

| | | |
|---|---|---|
| 2017/0063333 A1 | 3/2017 | Gilbert et al. |
| 2019/0036009 A1 | 1/2019 | Tai et al. |
| 2019/0267962 A1 | 8/2019 | Hyndman et al. |
| 2019/0288661 A1 | 9/2019 | Akiyama et al. |
| 2021/0006224 A1 | 1/2021 | Hori et al. |

FOREIGN PATENT DOCUMENTS

| | | |
|---|---|---|
| JP | 2003121133 A | 4/2003 |
| JP | 201486400 A | 5/2014 |
| JP | 6250856 B1 | 12/2017 |
| JP | 201957910 A | 4/2019 |
| WO | 2017092378 A1 | 6/2017 |
| WO | 2017163722 A1 | 9/2017 |
| WO | 2019181087 A1 | 9/2019 |

OTHER PUBLICATIONS

International Search Report with English Translation issued in corresponding International Application No. PCT/JP2020/042099 dated Dec. 22, 2020 (5 pages).
Written Opinion of International Searching Authority issued in corresponding International Application No. PCT/JP2020/042099 dated Dec. 22, 2020 (3 pages).
Extended European Search Report issued in corresponding European Application No. 20893072.7, dated Apr. 26, 2023 (7 pages).

\* cited by examiner

BONDED BODY OF PIEZOELECTRIC MATERIAL SUBSTRATE AND SUPPORTING SUBSTRATE

CROSS-REFERENCE TO RELATED APPLICATIONS

This is a continuation of PCT/JP2020/042099, filed Nov. 11, 2020, which claims priority to Japanese Application No. 2019-216520 filed on Nov. 29, 2019, the entire contents of which are hereby incorporated by reference.

TECHNICAL FIELD

The present invention relates to a bonded body of a piezoelectric material substrate and supporting substrate and an acoustic wave device.

BACKGROUND ARTS

It is known that, according to a surface acoustic wave filter obtained by adhering lithium tantalate and sapphire through a silicon oxide layer, a bulk wave is generated at the bonding interface so that unnecessary response is generated in the transmission band and the high frequency band. For preventing this, a roughened surface introduced at the bonding interface is proposed to scatter the bulk wave and to suppress the unnecessary response (patent documents 1 and 2).

According to patent document 1, in the case when the bonding surface is made into a roughened surface, as to the geometrical specification of the roughened surface, the ratio of an average length RSm of a factor in a cross sectional profile of convex-concave structure forming the roughened surface and a wavelength λ of a surface acoustic wave is 0.2 or larger and 7.0 or smaller, and the arithmetic average roughness Ra of the cross sectional profile of the convex-concave structure is 100 nm or larger. Further, a difference in height of a roughened surface is defined in patent document 2.

PATENT DOCUMENTS (Patent document 1) Japanese Patent No. 6250856B
(Patent document 2) U.S. Patent Publication No. 2017-063333A1

SUMMARY OF THE INVENTION

In the prior art, the convex-concave morphology (for example, RSm or Ra) of a bonding surface of a supporting substrate or piezoelectric material substrate was measured, and the values were adjusted to be slightly large for suppressing the spurious wave. However, even in the case when RSm's of the bonding surfaces are the same, there may be cases where the spurious wave could not be suppressed. It was thus shown that the spurious wave cannot be suppressed by simply adjusting the convex-concave morphology of the bonding surface.

An object of the present invention is to provide a novel structure for suppressing the spurious wave which cannot be suppressed by adjusting the surface morphology of a bonding surface of a piezoelectric material substrate or supporting substrate of a bonded body.

The present invention provides a bonded body comprising:
  a supporting substrate;
  a piezoelectric material substrate comprising a material selected from the group consisting of lithium niobate, lithium tantalate and lithium niobate-lithium tantalate; and
  a bonding layer bonding the supporting substrate and the piezoelectric material substrate, said bonding layer contacting a main surface of said piezoelectric material substrate,
  provided that at least one of a bonding surface of the supporting substrate and a bonding surface of the piezoelectric material substrate is measured by X-ray reflectivity method and that 1 is assigned to a signal intensity in the case of total reflection, a relative intensity I of a reflected light from the bonding surface is approximated by the following formula (1) in a range of $1.0 \times 10^{-4}$ or larger and $1.0 \times 10^{-1}$ or smaller.

$$I = a(2\theta)^{-b} \tag{1}$$

In the formula (1),
  θ represents an incident angle of an X-ray with respect to said bonding surface,
  a is $1.0 \times 10^{-5}$ or larger and $2.0 \times 10^{-3}$ or smaller, and
  b is 5.0 or larger and 9.0 or smaller.

The inventors have tried to make the bonding surface of the supporting substrate or piezoelectric material substrate a mirror surface and then form a roughened surface by mechanical processing, and the microstructure was observed and analyzed in detail. As a result, that minute defects or denaturing of the film, which cannot be evaluated based on the surface convex-concave morphology, are generated on the bonding surface after the mechanical processing. Based on such measurement results, it was determined that the effect of suppressing the spurious wave is needed to be controlled based not on the surface convex-concave morphology but based on the effective crystallographic and geometric characteristics in surface regions of the piezoelectric material substrate and bonding layer.

Based on such findings, the present inventors have researched various kinds of processing and measuring methods of the bonding surface. During the research, the inventors used an X-ray reflectivity method (XRR method, X-ray Reflection).

According to the X-ray reflectivity method, an X-ray is made incident onto a surface of a sample at an extremely low angle, and the X-ray intensity profile of reflected light reflected in the mirror direction of the incident angle is measured. According to the method, the profile obtained by the measurement is compared with the simulation results and the simulation parameters are optimized so that the film thickness and density of the sample are determined. That is, the X-ray reflectivity method is originally the method of measuring the film thickness and density of a thin film utilizing X-ray reflection from the thin film. This means that the reflected light reflected from the thin film carries information of the convex-concave nature of the surface of the thin film as well as information in the direction of depth of the thin film (film thickness and density).

The inventors tried to apply the X-ray reflectivity method onto the bonding surface after the roughening process of the piezoelectric material substrate or supporting substrate and to obtain information of denaturing or change of density in a region near the surface of the bonding surface, and researched the relationship of the information and the effect of suppressing the spurious wave.

That is, the bonding surface of the piezoelectric material substrate or supporting substrate is subjected to roughening process. Thereafter, the information of the crystallographic state in the surface region of the bonding surface is obtained by the X-ray reflectivity method. Specifically, an X-ray is made incident onto the bonding surface at a very low angle and the reflected light is then measured. Here, provided that θ is assigned to the incident angle of the X-ray, θ is gradually changed from 0° to record the relative intensity I of the reflected light. The relative intensity I is defined as a relative intensity provided that 1 is assigned to the signal intensity at the total reflection. It is known that the relative intensity I is damped in proportion with $1 \times 10^{-4}$ in the case where the bonding surface is ideally flat. However, it has been shown that the spurious wave is generated when the bonding surface is a flat mirror surface and that the spurious wave still cannot be suppressed even when the bonding surface is roughened as far as the relative intensity has a proportional coefficient near $1 \times 10^{-4}$.

Thus, the inventors performed the measurement of the bonding surface, after various kinds of roughening processes, by the X-ray reflectivity method, and measured the degree of suppressing the spurious wave. As a result, it was found that the relative density I of the reflected light from the bonding surface can be approximated with the formula (1), in a range of $1.0 \times 10^{-4}$ or larger and $1.0 \times 10^{-1}$ or smaller.

That is, as schematically shown in FIG. 1, for example, the relative intensity I is held at about 1 in a range of incident angle θ of 0.0° to about 0.5°, and is then rapidly lowered thereafter. It was then shown that the following approximation formula is satisfied in a region surrounded by the rectangle (in a range of the relative intensity I of $1.0 \times 10^{-4}$ or larger and $1.0 \times 10^{-1}$ or smaller). In the case where the relative intensity is smaller than that range, it is approximately a straight line viewed on a logarithmic scale.

$$I = a(2\theta)^{-b} \quad (1)$$

Here, the index b is 5.0 or larger and coefficient a can be approximated as $1.0 \times 10^{-5}$ to $2.0 \times 10^{-3}$. This means that the relative intensity I is decreased more rapidly as the incident angle θ is increased as compared to the case when the bonding surface is a mirror surface. Further, this means that the crystals are denatured in the surface region of the bonding surface or defects are generated other than the minute convex-concave morphology on the surface. It was found that the spurious wave can be suppressed under such conditions.

Further, as the index b exceeds 9.0, the spurious wave is actually increased. It is thus necessary to make b 9.0 or smaller.

MODES FOR CARRYING OUT THE INVENTION

Figure 1:
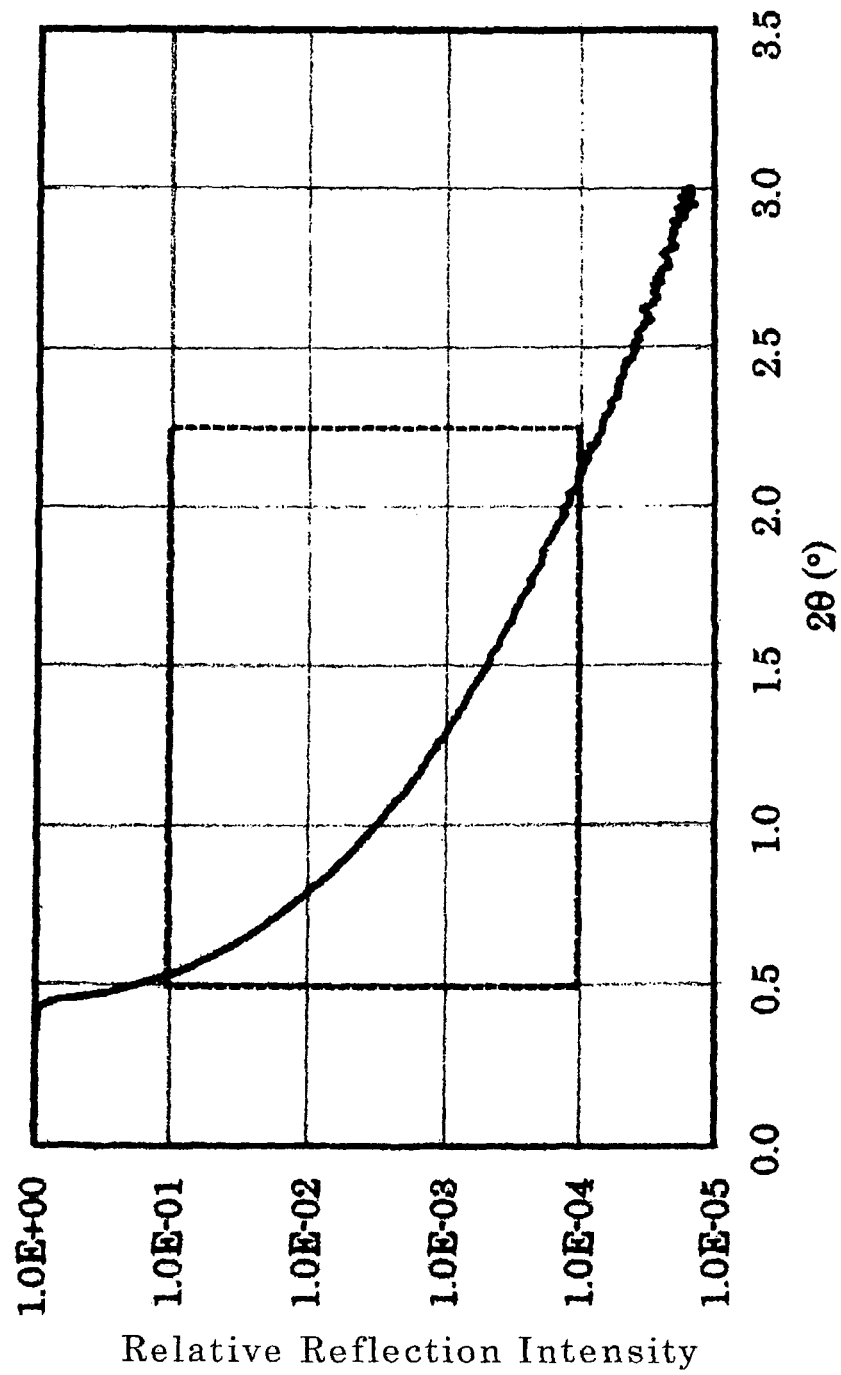
FIG. 1 is a model chart showing the relationship between an incident angle θ and relative density I of a reflected light.

Embodiments of the present invention will be described in detail below, appropriately referring to the drawings.

Figure 2A:
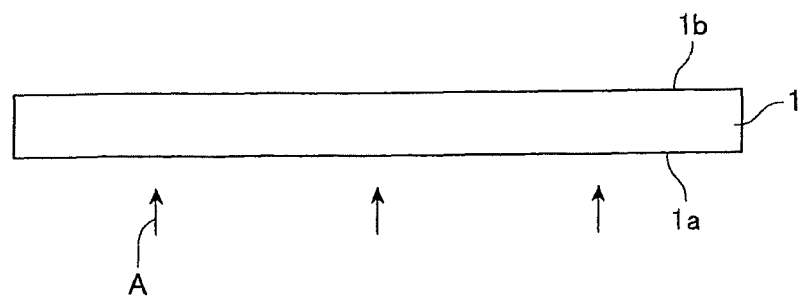
FIG. 2(a) shows the state that a bonding surface of a supporting substrate is processed.
Figure 2B:
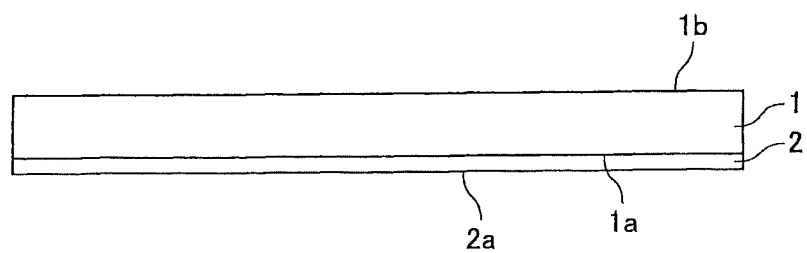
FIG. 2(b) shows the state that a bonding layer is provided on the bonding surface of the supporting substrate.
Figure 2C:
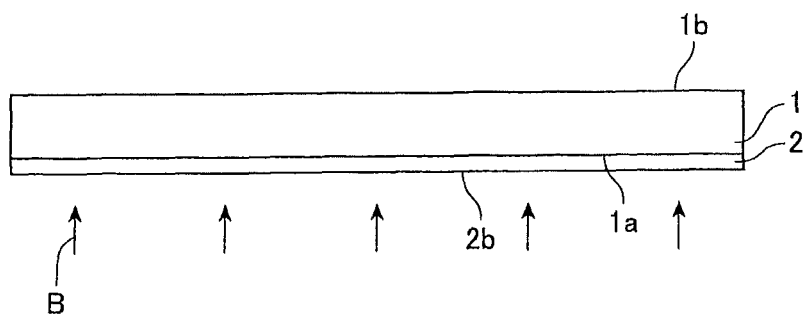
FIG. 2(c) shows the state that plasma is irradiated onto a bonding surface of the bonding layer to activate the surface.

First, as shown in FIG. 2(a), a supporting substrate 1 having a pair of main surfaces 1a and 1b is prepared. Processing A is then performed on the main surface (bonding surface) 1a to roughen the surface. Then, as shown in FIG. 2(b), a bonding layer 2 is film-formed on the main surface 1a of the supporting substrate 1. The surface 2a of the bonding layer 2 is subjected to CMP polishing for obtaining a mirror surface. Then, as shown in FIG. 2(c), plasma is irradiated onto the surface 2a of the bonding layer 2 to obtain a surface-activated bonding surface 2b.

Figure 3A:
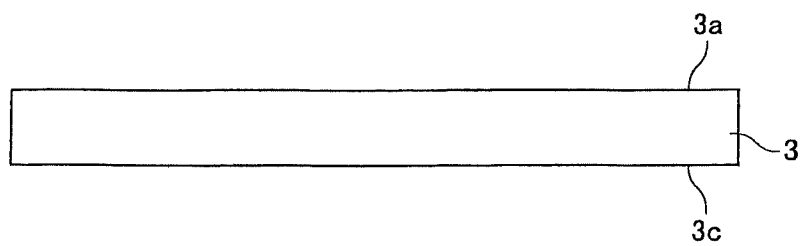
FIG. 3(a) shows a piezoelectric material substrate.

Further, as shown in FIG. 3(a), a piezoelectric material substrate 3 having a main surface 3a is prepared. Plasma is irradiated onto the main surface of the piezoelectric material substrate 3 as arrows C to activate the surface to form a surface-activated bonding surface 3b.

Figure 4A:
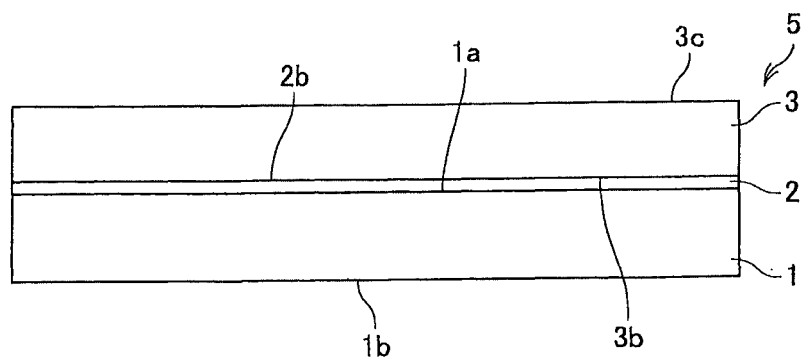
FIG. 4(a) shows a bonded body of the supporting substrate and piezoelectric material substrate.

The activated bonding surface 2b of the bonding layer 2 on the supporting substrate and the activated bonding surface 3b of the piezoelectric material substrate 3 are contacted with each other and subjected to direct bonding, to obtain a bonded body 5 shown in FIG. 4(a).

Figure 4B:
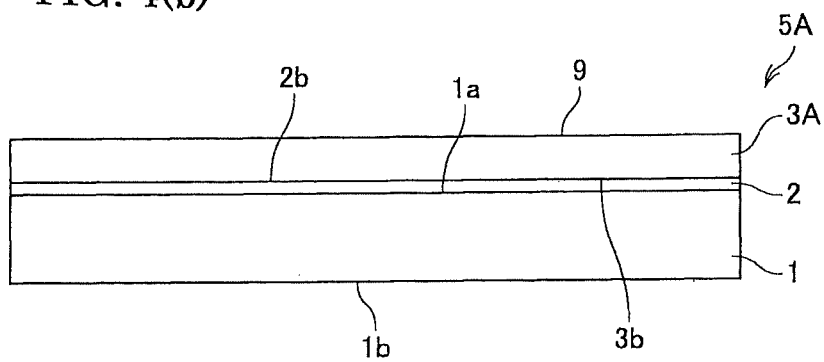
FIG. 4(b) shows the state that a piezoelectric material substrate of a bonded body is thinned.
Figure 4C:
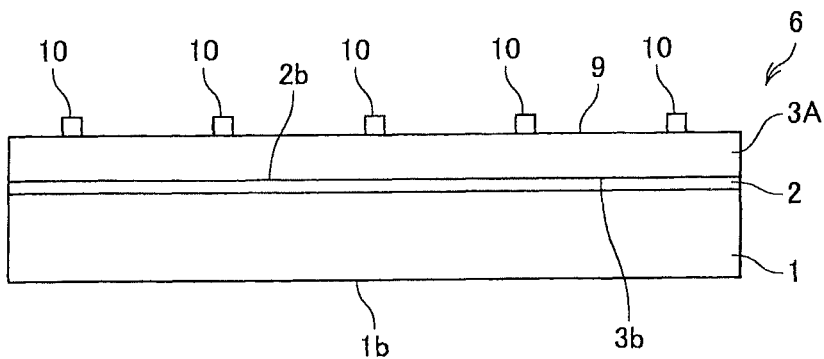
FIG. 4(c) shows an acoustic wave device.

At this stage, electrodes may be provided on the piezoelectric material substrate 3. However, preferably, as shown in FIG. 4(b), the main surface 3c of the piezoelectric material substrate 3 is processed to thin the substrate 3 to form a thinned piezoelectric material substrate 3A so that a bonded body 5A is provided. 9 represents a processed surface. Then, as shown in FIG. 4(c), predetermined electrodes 10 may be formed on the processed surface 9 of the piezoelectric material substrate 3A of the bonded body 5A to obtain an acoustic wave device 6.

Further, an intermediate layer may be provided between the bonding layer 2 and the piezoelectric material substrate 3. FIGS. 5 and 6 relate to this embodiment.

According to the present example, as shown in FIG. 2(a), a supporting substrate 1 having a pair of main surfaces 1a and 1b is prepared. Processing A is then performed on the main surface (bonding surface) la for roughening. Then, as shown in FIG. 2(b), a bonding layer 2 is film-formed on the main surface 1a of the supporting substrate 1. The surface of the bonding layer 2 is subjected to CMP polishing for obtaining a mirror surface. Then, as shown in FIG. 2(c), plasma is irradiated onto the bonding surface of the bonding layer 2 as arrows B to obtain a surface-activated bonding surface 2b.

Figure 5A:
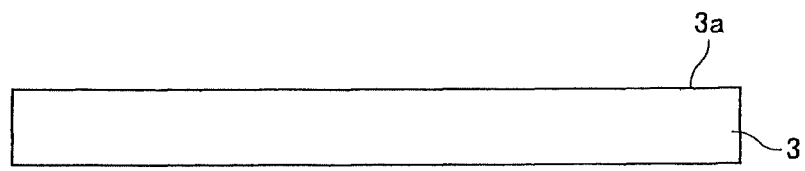
FIG. 5(a) shows the piezoelectric material substrate.
Figure 5B:
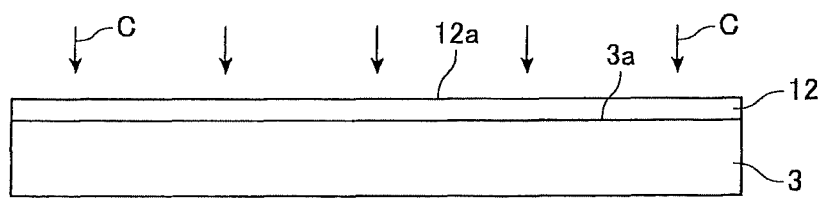
FIG. 5(b) shows the state that a bonding surface of an intermediate layer on the piezoelectric material substrate is activated.

Further, as shown in FIG. 5(a), a piezoelectric material substrate 3 having a main surface 3a is prepared. Then, as shown in FIG. 5(b), an intermediate layer 12 is formed on the main surface (bonding surface) 3a of the piezoelectric material substrate 3, and plasma is irradiated onto the surface of the intermediate layer 12 as arrows C to perform the surface activation to form a surface-activated bonding surface 12a.

Figure 6A:
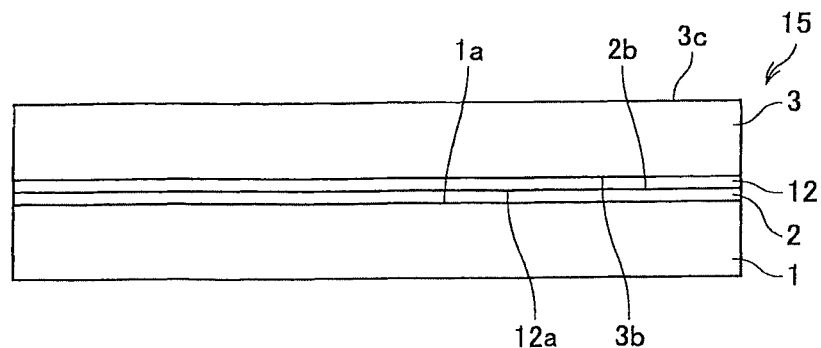
FIG. 6(a) shows a bonded body of the supporting substrate and piezoelectric material substrate.

Then, the activated surface 2b of the bonding layer 2 on the supporting substrate and the activated bonding surface 12a of the intermediate layer 12 on the piezoelectric material substrate 3 are contacted with and directly bonded with each other, to obtain a bonded body 15 shown in FIG. 6(a).

Figure 6B:
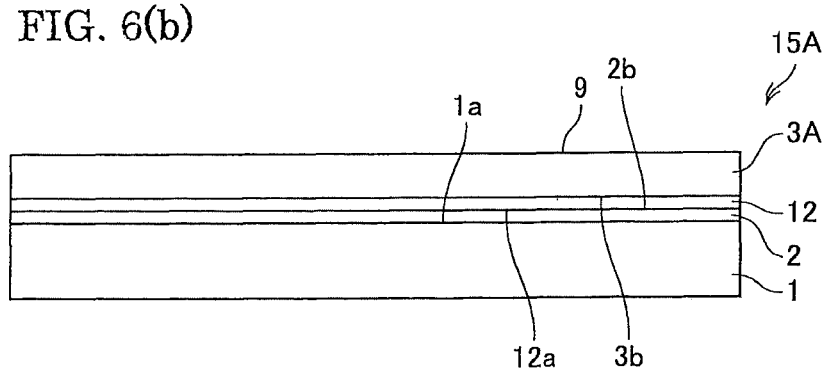
FIG. 6(b) shows the state that the piezoelectric material substrate of a bonded body is thinned by processing.
Figure 6C:
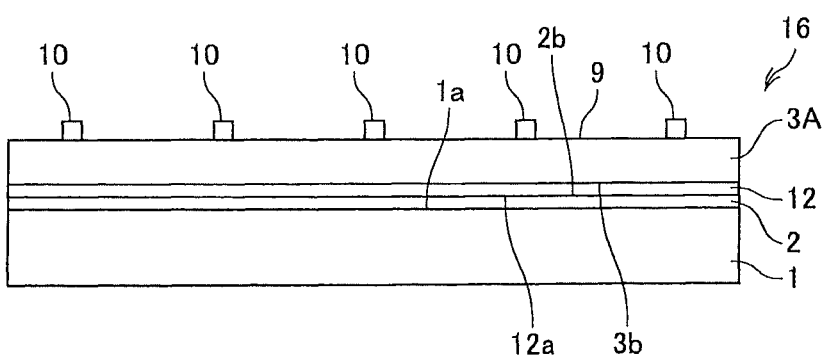
FIG. 6(c) shows an acoustic wave device.

At this stage, electrodes may be provided on the piezoelectric material substrate 3. However, preferably, as shown in FIG. 6(b), the main surface 3c of the piezoelectric material substrate 3 is processed to thin the substrate 3 to form a thinned piezoelectric material substrate 3A so that a bonded body 15A is provided. 9 represents a processed surface. Then, as shown in FIG. 6(c), predetermined electrodes 10 may be formed on the processed surface 9 of the piezoelectric material substrate 3A of the bonded body 15A to obtain an acoustic wave device 16.

Alternatively, after the bonding layer 2 is film-formed, the intermediate layer 12 may be subsequently film-formed on the bonding layer 2. In this case, CMP processing is performed on the surface of the intermediate layer 12 to obtain a bonding surface (mirror surface). Plasma is irradiated onto the thus obtained bonding surface to activate the surface. The surface of the supporting substrate is then subjected to plasma activation and directly bonded with the bonding surface of the intermediate layer.

According to the present invention, b is 5.0 or larger. Further, b is 9.0 or smaller and is preferably 7.0 or smaller. Further, according to the present invention, a is $1.0 \times 10^{-5}$ or larger, and is preferably $1.0 \times 10^{-4}$ or larger. Further, a is $2.0 \times 10^{-3}$ or smaller and is preferably $1.0 \times 10^{-3}$ or smaller.

According to a preferred embodiment, a and b satisfy the following formula (2).

$$-0.713 \cdot \ln(a) + 0.5 \leq b \leq -0.713 \cdot \ln(a) + 0.7 \quad (2)$$

According to another preferred embodiment, a and b satisfy the following formula (3).

$$b = -0.713 \cdot \ln(a) + 0.6 \quad (3)$$

The measurement condition for the X-ray reflectivity method is as follows.

Measurement system: "SmartLab" supplied by Rigaku Corporation
Measurement condition:
X-ray generating part: Anti-cathode; Cu
  : Output power; 5kV 200mA
Detecting part: Semiconductor detector
Incident optical system: Ge (111) Unsymmetrical beam condensation crystal
Solar slit: incident side; –
  Reception side: 5.0°
Slit: Reception side: IS=0.05 (mm)
  : Longitudinal limit 5 (mm)
  : Reception side: RS1=0.1 RS2=0.1 (mm)

-continued

Scanning condition: Scanning axis; 2θ/ω
  Scanning mode: continuous scanning
  Scanning speed: 0.2° /min
  Step width: 0.002°
  Analysis range: 0.3~3.0°
It is preferred to apply the following processing It is preferred to apply the following processing method for controlling the measurement results by the X-ray reflectivity method of the bonding surfaces of the piezoelectric material substrate and supporting substrate as described above.

As to the method for roughening the surfaces, a mechanical processing method such as grinding process by grinding stones or blast processing by micro media such as alumina or silicon nitride, and ion beam processing of colliding ions at a high speed may be used.

Respective constituents of the present invention will be described further in detail below.

Although the material of the supporting substrate 1 is not particularly limited, the material is preferably selected from the group consisting of silicon, quartz, sialon, mullite, sapphire and translucent alumina. It is thus possible to further improve the temperature characteristics on frequency of the acoustic wave device 6 or 16.

Although the film-forming method of the bonding layer or intermediate layer is not particularly limited, a sputtering method, a chemical vapor deposition (CVD) method or a vapor deposition method may be used.

Although the material of the bonding layer 2 is not particularly limited as far as the surface activation process is concerned, a metal oxide film is preferred, and the material may preferably be selected from the group consisting of silicon oxide, silicon nitride, aluminum nitride, alumina, tantalum pentoxide, mullite, niobium pentoxide and titanium oxide. Further, as the surface activation method, an appropriate method may be selected depending on the material used for the bonding layer. Such a surface activation method includes plasma activation or FAB (Ar atomic beam).

Although the material of the intermediate layer 12 is not particularly limited as far as the surface activation processing is concerned, a metal oxide film is preferred, and a material selected from the group consisting of silicon oxide, silicon nitride, aluminum nitride, alumina, tantalum pentoxide, mullite, niobium pentoxide and titanium oxide is particularly preferred. Further, it is preferred to select the material of the intermediate layer to be different from that of the bonding layer.

The thickness of the bonding layer 2 is preferably 0.05 μm or larger, more preferably 0.1 μm or larger and most preferably 0.2 μm or larger. Further, the thickness of the bonding layer 2 is preferably 3 μm or smaller, more preferably 2 μm or smaller and further preferably 1 μm or smaller.

The piezoelectric material substrate 3 used in the present invention is composed of lithium tantalate (LT) single crystal, lithium niobate (LN) single crystal, or lithium niobate-lithium tantalate solid solution. As the materials have a high propagation speed of an acoustic wave and a large electromechanical coupling factor, they are suitable for a surface acoustic wave device of a high frequency and wide-band frequency application.

Further, although the normal line direction of the main surface 3a of the piezoelectric material substrate 3 is not particularly limited, for example, in the case that the piezoelectric material substrate 3 is made of LT, it is preferred to use the substrate rotated from Y-axis toward Z-axis by 32 to 55°, (180°, 58 to 35°, 180°) on Euler angle representation, around X-axis, which is a direction of propagation of a surface acoustic wave, because of a low propagation loss. In the case that the piezoelectric material substrate 3 is made of LN, (i) it is preferred to use the substrate rotated from Z axis toward Y-axis by 37.8°, (0°, 37.8°, 0°) on Euler angle representation, around X-axis, which is the direction of propagation of the surface acoustic wave, because of a larger electromechanical coupling factor. Alternatively, (ii) it is preferred to use the substrate rotated from Y-axis toward Z-axis by 40 to 65°, (180°, 50 to 25°, 180°) on Euler angle representation, around X-axis, which is the direction of propagation of the surface acoustic wave, because of a high sound velocity. Further, although the size of the piezoelectric material substrate 3 is not particularly limited, for example, the diameter may be 100 to 200 mm and thickness may be 0.15 to 1 μm.

Plasma is then irradiated onto the bonding surfaces of the bonding layer 2 on the supporting substrate 1, piezoelectric material substrate 3 and intermediate layer 12 on the piezoelectric material substrate 3 at a temperature of 150° C. or lower, to activate the bonding surfaces. Although it is preferred to irradiate nitrogen plasma, it is possible to obtain the inventive bonded body even when oxygen plasma is irradiated.

The pressure during the surface activation is preferably 100 Pa or lower and more preferably 80 Pa or lower. Further, the atmosphere may be composed of nitrogen only, oxygen only or mixture of nitrogen and oxygen.

The temperature during plasma irradiation is 150° C. or lower. It is thus possible to obtain a bonded body having a high bonding strength without deterioration of crystallinity. The temperature during the plasma irradiation is 150° C. or lower, and is preferably 100° C. or lower.

Further, the energy of the plasma irradiation is preferably 30 to 150 W. Further, the product of the energy and irradiation time duration of the irradiated plasma is preferably 0.12 to 1.0 Wh.

The plasma-treated bonding surfaces of the piezoelectric material substrate and bonding layer are contacted with each other at room temperature. The treatment may be performed in vacuum and the contact is preferably performed in atmosphere.

When the activation of the surfaces is performed using the argon atomic beam, it is preferred to use a system described in Japanese patent publication No. 2014-086400A to generate the argon atomic beam, which is irradiated. That is, a high-speed atomic beam source of saddle field type is used as the beam source. Then, inert gas is introduced into the chamber and a high voltage is applied onto electrodes from a direct current electric source. By this, an electric field of saddle field type is generated between the electrode (positive electrode) and a housing (negative electrode) causing motion of electrons, e, so that argon atomic and ion beams are generated. Among the beams reached at the grid, the ion beam is neutralized at the grid, and the beam of argon atoms is emitted from the high-speed atomic beam source. In the activation step by beam irradiation, the voltage is preferably 0.5 to 2.0 kV, and the current is preferably 50 to 200 mA.

According to a preferred embodiment, before the surface activation treatment, the bonding surfaces of the bonding layer on the supporting substrate, of the piezoelectric material substrate and of the intermediate layer on the piezoelectric material substrate are subjected to a flattening process. The method of flattening the respective surfaces includes lapping, chemical mechanical polishing (CMP) and the like. Further, the flattened surfaces preferably have an Ra of 1 nm or lower and more preferably 0.3 nm or lower.

Then, the bonding surface of the bonding layer on the supporting substrate and the bonding surface of the piezoelectric material substrate 3 or bonding surface of the intermediate layer are contacted and bonded with each other. Thereafter, it is preferred to improve the bonding strength by performing annealing treatment. The temperature for the annealing treatment is preferably 100° C. or higher and 300° C. or lower.

The bonded bodies 5, 5A, 15 and 15A of the present invention can be appropriately used for the acoustic wave devices 6 and 16. That is, an acoustic wave device having the bonded body of the present invention and an electrode provided on the piezoelectric material substrate is provided.

Specifically, as the acoustic wave devices 6 and 16, a surface acoustic wave device, Lamb wave-type device, thin film resonator (FBAR) and the like are known. For example, the surface acoustic wave device is produced by providing input side IDT (Interdigital transducer) electrodes (also referred to as comb electrodes or interdigitated electrodes) for an oscillating surface acoustic wave and IDT electrodes on the output side for receiving the surface acoustic wave on the surface of the piezoelectric single crystal substrate. By applying a high frequency signal on the IDT electrodes on the input side, an electric field is generated between the electrodes, so that the surface acoustic wave is oscillated and propagated on the piezoelectric substrate. Then, the propagated surface acoustic wave is drawn as an electrical signal from the IDT electrodes on the output side provided in the direction of the propagation.

The material forming the electrodes 10 on the piezoelectric material substrate 3A is preferably aluminum, aluminum alloy, copper or gold and more preferably aluminum or aluminum alloy. The aluminum alloy used is preferably Al doped with 0.3 to 5 weight percent of Cu. In this case, Ti, Mg, Ni, Mo, or Ta may be used instead of Cu.

EXAMPLES

Inventive Example 1

Figure 3B:
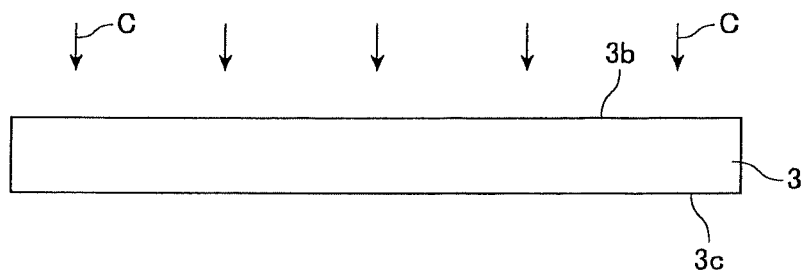
FIG. 3(b) shows the state that a bonding surface of the piezoelectric material substrate is activated.

An acoustic wave device 6 shown in FIG. 4(c), according to the method described referring to FIGS. 2 to 4 was produced.

Specifically, one main surface 3c of a 42Y-cut X-propagation $LiTaO_3$ substrate (piezoelectric material substrate) 3 having a thickness of 250 μm was polished into mirror surface and the other main surface 3a was subjected to lapping with GC #1000. Further, a Si(100) substrate (supporting substrate) 1 having a thickness of 0.23 mm and high resistance (>2kΩ·cm) was prepared. The sizes of the respective substrates were 150 mm.

The bonding surface of the supporting substrate was then subjected to processing into a roughened surface. According to the present example, a grinding process using grinding stones of number of #6000 was performed. The amount of the processing was about 3 μm.

By using the X-ray reflectivity method of the bonding surface of the supporting substrate and the relative signal intensity was approximated based on the formula (1), values of a of $9.2 \times 10^{-4}$ and b of 5.55 were obtained.

A silicon oxide film 2 was the film-formed in 0.7 μm on the bonding surface 1a of the supporting substrate 1, and the surface was polished by CMP (chemical mechanical polishing) in about 0.2 um for the flattening. Then, the bonding surface 3b of the piezoelectric material substrate 3 and bonding surface of the silicon oxide film 2 were activated by $N_2$ plasma, respectively, and then bonded with each other in atmosphere. Specifically, as the surface roughness of the bonding layer after the polishing was measured by AFM (Atomic force Microscope), it was confirmed that a mirror surface having an Ra of 0.4 nm could be obtained sufficient for the bonding.

Then, the bonding surface 3b of the piezoelectric material substrate 3 and bonding surface 2b of the bonding layer 2 were subjected to cleaning and surface activation. Specifically, ultrasonic cleaning by pure water was performed and the substrate surface was dried by spin drying. Then, the supporting substrate after the cleaning was introduced into a plasma activation chamber and the bonding surface of the bonding layer was activated at 30° C. by nitrogen plasma. The piezoelectric material substrate 3 was similarly introduced in the plasma activation chamber and subjected to surface activation by nitrogen plasma at 30° C. The time period of the surface activation was 40 seconds, and the energy was 100 W. The ultrasonic cleaning and spin drying were performed again as described above, for removing particles adhered during the surface activation.

The positions of the respective substrates were then adjusted so that the bonding surfaces of the respective activated substrates were contacted with each other at room temperature. The piezoelectric material substrate 3 was positioned on the upper side when the substrates were contacted. As a result, the state (so-called bonding wave) was observed and that the adhesion of the substrates was spreading to prove that good preliminary bonding was accomplished. The bonded body was then charged into an oven filled with nitrogen atmosphere and held at 130° C. for 40 hours, for improving the bonding strength.

The surface 3c of the piezoelectric material substrate 3 of the bonded body after the heating was subjected to grinding, lapping and CMP processing so that the thickness of the piezoelectric material substrate 3A reached 7 μm.

Then, for confirming the effects of the present invention, a comb-shaped electrode made of aluminum metal was formed on the piezoelectric material substrate of the bonded body, to produce a resonator of a surface acoustic wave device. The specification of the device is as follows.

| | |
|---|---|
| IDT period: | 6 μm |
| IDT opening length: | 300 um |
| Number of IDT lines: | 80 lines |
| Number of lines of reflector: | 40 lines |

Figure 7:
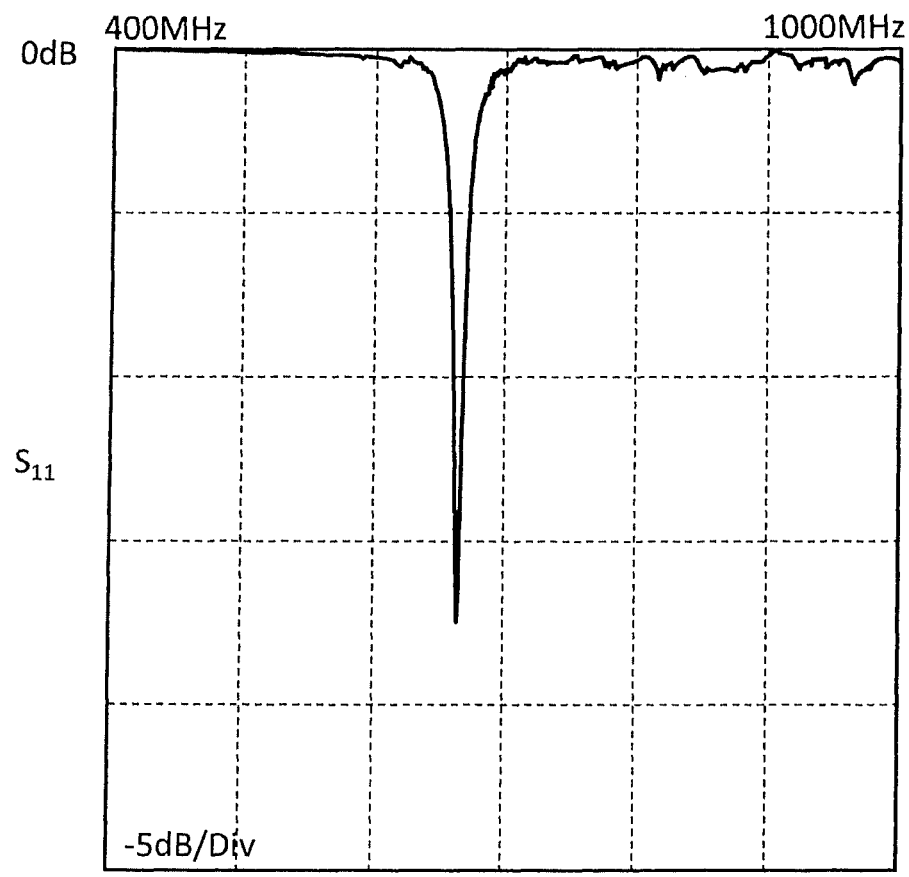
FIG. 7 is a chart showing reflection characteristics of a surface acoustic wave device of the inventive example.

As the reflection characteristics of the resonator were measured by a network analyzer, spurious wave was hardly observed in a range higher than an anti-resonance frequency, as shown in FIG. 7. The value of the spurious wave was 2.7 dB.

The results are shown in Table 1.

Inventive Example 2

The resonator of the surface acoustic wave device was produced according to the same procedure as that in Inventive Example 1, and the reflection characteristics of the resonator were measured by the network analyzer. However, the processing of the bonding surface of the supporting substrate was performed by grinding the bonding surface by grinding stones of #8000.

As spectrum of the bonding surface of the supporting substrate was obtained by the X-ray reflectivity method and the relative signal intensity was approximated by the formula (1), values of a of $7.1 \times 10^{-4}$ and b of 5.80 were obtained. The magnitude of the spurious wave was 3.2 dB.

Inventive Example 3

The resonator of the surface acoustic wave device was produced according to the same procedure as Inventive Example 1, and the reflection characteristics of the resonator were measured by the network analyzer. However, the processing of the bonding layer of the supporting substrate was performed by blasting of the whole surface of the substrate with silicon nitride particles. The amount of the processing was evaluated and was as small as 10 nm.

As spectrum of the bonding surface of the supporting substrate was obtained by the X-ray reflectivity method and the relative signal intensity was approximated by the formula (1), values of a of $2.2 \times 10^{-5}$ and b of 8.84 were obtained. The magnitude of the spurious wave was 4.8 dB.

Inventive Example 4

The resonator of the surface acoustic wave device was produced according to the same procedure as that of Inventive Example 1, and the reflection characteristics of the resonator were measured by the network analyzer. However, the processing of the bonding surface of the supporting substrate was performed by charging the supporting substrate in an ion processing machine and by colliding Ar ions accelerated at 0.5 keV.

As spectrum of the bonding surface of the supporting substrate was obtained by the X-ray reflectivity method and the relative signal intensity was approximated by the formula (1), values of a of $5.6 \times 10^{-5}$ and b of 7.63 were obtained. The magnitude of the spurious wave was 3.3 dB.

Inventive Example 5

The resonator of the surface acoustic wave device was produced according to the same procedure as that of Inventive Example 1, and the reflection characteristics of the resonator were measured by the network analyzer. However, the processing of the bonding surface was performed by charging the supporting substrate in an ion processing machine and by colliding Ar ions accelerated at 1.0 keV.

As spectrum of the bonding surface of the supporting substrate was obtained by the X-ray reflectivity method and the relative signal intensity was approximated by the formula (1), values of a of $1.8 \times 10^{-3}$ and b of 5.12 were obtained. The magnitude of the spurious wave was 3.5 dB.

Comparative Example 1

Figure 8:
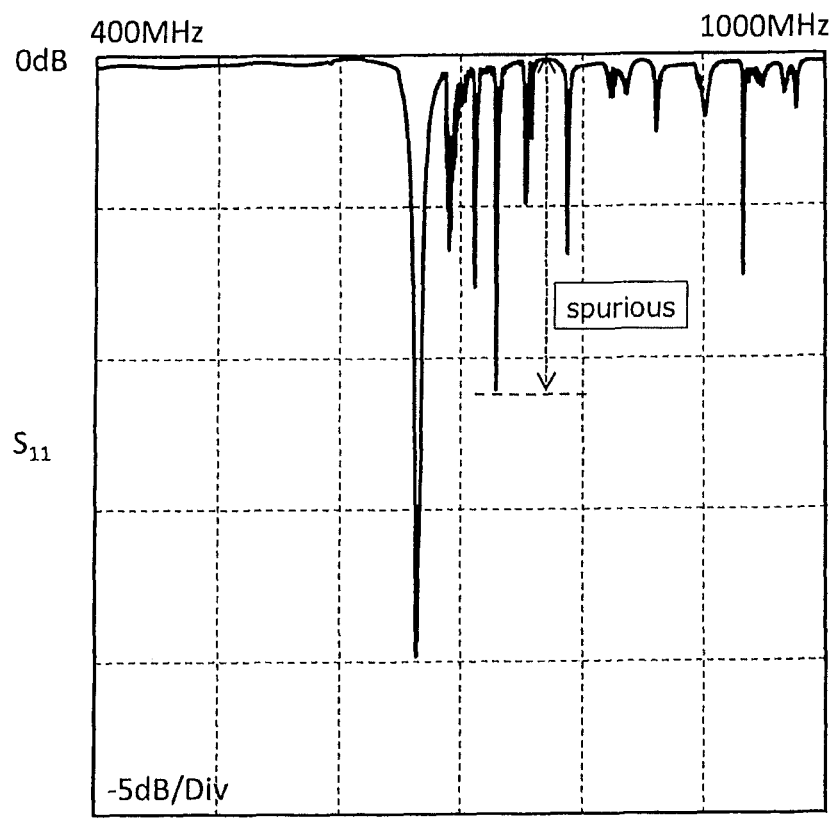
FIG. 8 is a chart showing reflection characteristics of a surface acoustic wave device according to a comparative example.

The resonator of the surface acoustic wave device was produced according to the same procedure as that of Inventive Example 1, and the reflection characteristics of the resonator was measured by the network analyzer. However, as the bonding surface of the supporting substrate was made a mirror surface, the Ra was 0.02 nm and the approximation by the formula (1) could not be made. Spurious wave was observed in the reflection characteristics, as shown in FIG. 8. The magnitude of the spurious wave was 12 dB.

TABLE 1

|  | a | B | Spurious |
|---|---|---|---|
| Inventive Example 1 | $9.2 \times 10^{-4}$ | 5.55 | 2.7 |
| Inventive Example 2 | $7.1 \times 10^{-4}$ | 5.80 | 3.2 |
| Inventive Example 3 | $2.2 \times 10^{-5}$ | 8.84 | 4.8 |
| Inventive Example 4 | $5.6 \times 10^{-5}$ | 7.63 | 3.3 |
| Inventive Example 5 | $1.8 \times 10^{-3}$ | 5.12 | 3.5 |
| Comparative Example 1 | — | — | 12 |

The invention claimed is:

1. A bonded body comprising:
   a supporting substrate;
   a piezoelectric material substrate comprising a material selected from the group consisting of lithium niobate, lithium tantalate and lithium niobate-lithium tantalate; and
   a bonding layer bonding said supporting substrate and said piezoelectric material substrate,
   wherein at least one of a bonding surface of said supporting substrate and a bonding surface of said piezoelectric material substrate has a relative intensity I of a reflected light from said bonding surface in a range of $1.0 \times 10^{-4}$ or larger and $1.0 \times 10^{-1}$ or smaller when measured by an X-ray reflectivity method and 1 is assigned to a signal intensity in the case of total reflection, as calculated by the following formula (1):

$$I = a(2\theta)^{-b} \quad (1)$$

where
   $\theta$ represents an incident angle of an X-ray with respect to said bonding surface,
   a is $1.0 \times 10^{-5}$ or larger and $2.0 \times 10^{-3}$ or smaller, and
   b is 5.0 or larger and 9.0 or smaller,
   the bonded body further comprising a surface denatured region adjacent said at least one bonding surface, said surface denatured region disposed to being subjected to said X-ray reflectivity method when I is measured.

2. The bonded body of claim 1, wherein said at least one bonding surface adjacent said surface denatured region has a roughened surface.

3. The bonded body of claim 1, wherein the bonded body has a spurious value of 4.8 dB or less.

4. The bonded body of claim 1, wherein said bonding layer comprises a material selected from the group consisting of silicon oxide, silicon nitride, aluminum nitride, alumina, tantalum pentoxide, mullite, niobium pentoxide and titanium oxide.

5. The bonded body of claim 1, wherein said supporting substrate comprises a material selected from the group consisting of silicon, quartz, sialon, mullite, sapphire and translucent alumina.

6. The bonded body of claim 5, wherein said supporting substrate comprises silicon.

7. The bonded body of claim 1, wherein said supporting substrate comprises said at least one bonding surface adjacent said surface denatured region.

8. The bonded body of claim 1, wherein said at least one bonding surface adjacent said surface denatured region is provided by grinding with grinding stones, by blast processing with micro media or by ion beam processing.

9. The bonded body of claim 8, wherein said at least one bonding surface adjacent said surface denatured region is provided by grinding with grinding stones, by blast processing with micro media or by ion beam processing of a mirror surface.

10. The bonded body of claim 8, wherein said at least one bonding surface adjacent said surface denatured region is provided by grinding with grinding stones of #6000 to #8000.

11. The bonded body of claim 8, wherein said at least one bonding surface adjacent said surface denatured region is provided by blast processing with micro media comprising alumina or silicon nitride.

12. The bonded body of claim 8, wherein said at least one bonding surface adjacent said surface denatured region is provided by ion beam processing with colliding Ar ions.

* * * * *